US009640542B2

(12) United States Patent
Lee et al.

(10) Patent No.: US 9,640,542 B2
(45) Date of Patent: May 2, 2017

(54) SEMICONDUCTOR DEVICE HAVING CONTACT PADS

(71) Applicant: SK hynix Inc., Gyeonggi-do (KR)

(72) Inventors: Ki Hong Lee, Gyeonggi-do (KR); Seung Ho Pyi, Gyeonggi-do (KR); Ji Yeon Baek, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/090,318

(22) Filed: Apr. 4, 2016

(65) Prior Publication Data

US 2016/0218107 A1 Jul. 28, 2016

Related U.S. Application Data

(62) Division of application No. 14/289,211, filed on May 28, 2014, now Pat. No. 9,331,082.

(30) Foreign Application Priority Data

Dec. 20, 2013 (KR) .......................... 10-2013-0160219

(51) Int. Cl.

| | |
|---|---|
| *H01L 23/528* | (2006.01) |
| *H01L 23/532* | (2006.01) |
| *H01L 27/105* | (2006.01) |
| *H01L 27/115* | (2006.01) |
| *H01L 27/11548* | (2017.01) |
| *H01L 27/11575* | (2017.01) |
| *H01L 23/522* | (2006.01) |

(Continued)

(52) U.S. Cl.
CPC .......... *H01L 27/115* (2013.01); *H01L 23/528* (2013.01); *H01L 23/5226* (2013.01); *H01L 27/1052* (2013.01); *H01L 27/11548* (2013.01); *H01L 27/11575* (2013.01); *H01L 27/11556* (2013.01); *H01L 27/11582* (2013.01); *H01L 2924/0002* (2013.01)

(58) Field of Classification Search
CPC ................ H01L 23/528; H01L 23/532; H01L 27/11548; H01L 27/11575; H01L 27/11556; H01L 27/11582; H01L 21/02107; H01L 29/7827; H01L 23/538; H01L 23/53271; H01L 27/1052; H01L 27/105; H01L 27/2257; H01L 27/22582; H01L 27/22548; H01L 27/22575; H01L 27/22556; H01L 37/11582
USPC ....... 257/330, 773, 774, 701, 702, 703, 758, 257/324
See application file for complete search history.

(56) References Cited

U.S. PATENT DOCUMENTS

| | | | | |
|---|---|---|---|---|
| 9,331,082 | B2 * | 5/2016 | Lee ..................... | H01L 27/1052 |
| 2013/0323930 | A1 * | 12/2013 | Chattopadhyay . | H01L 21/02107 438/703 |

(Continued)

*Primary Examiner* — Alexander Oscar Williams
(74) *Attorney, Agent, or Firm* — IP & T Group LLP

(57) ABSTRACT

A semiconductor device includes a stacked structure having first conductive layers stacked stepwise and first insulating layers interposed between the first conductive layers, wherein undercuts are formed under the first conductive layers and each of the first conductive layers includes a first region covered by the first conductive layer and a second region extending from the first region, contact pads coupled to the second regions of the respective first conductive layers, and a liner layer formed on the contact pads and filling the undercuts.

10 Claims, 19 Drawing Sheets

(51) Int. Cl.
     *H01L 27/11556*    (2017.01)
     *H01L 27/11582*    (2017.01)

(56) References Cited

U.S. PATENT DOCUMENTS

2014/0138765 A1*   5/2014   Lee ..................... H01L 29/7827
                                                                                                                            257/330
2015/0179564 A1*   6/2015   Lee ................... H01L 27/11548
                                                                                                                            257/756

\* cited by examiner

US 9,640,542 B2

SEMICONDUCTOR DEVICE HAVING CONTACT PADS

CROSS-REFERENCE TO RELATED APPLICATION

This application is a division of U.S. patent application Ser. No. 14/289,211 filed on May 28, 2014 and issued on May 3, 2016 as U.S. Pat. No. 9,331,082, which claims priority to Korean patent application number 10-2013-0160219, filed on Dec. 20, 2013. The entire disclosure of each of the foregoing applications is incorporated herein in its entirety by reference.

BACKGROUND

Field of Invention

Various exemplary embodiments of the present invention relate generally to an electronic device, and more particularly, to a semiconductor device and a method of manufacturing the same.

Description of Related Art

A non-volatile memory device preserves the stored data even when the power is cut off. Two-dimensional memory devices in which memory cells are fabricated in a single layer over a silicon substrate have reached physical limits in increasing their degree of integration. Accordingly, three-dimensional (3D) non-volatile memory devices in which memory cells are stacked in a direction perpendicular to a silicon substrate have been proposed.

A 3D non-volatile memory device may include interlayer insulating layers and word lines stacked alternately and channel layers passing therethrough, in which memory cells may be stacked along the channel layers. Additionally, desired memory cells may be selectively driven by coupling contact plugs to the stacked word lines.

However, since contact plugs need to be formed at various depths to realize the 3D non-volatile memory device configured as described above, manufacturing processes may be difficult to perform. In addition, a bridge may be formed when the contact plugs pass through the word lines.

SUMMARY

Exemplary embodiments of the present invention are directed to a semiconductor device having simplified manufacturing processes and a stabilized structure, and a method of manufacturing the same.

A semiconductor device according to an embodiment of the present invention may include a stacked structure having first conductive layers stacked stepwise and first insulating layers interposed between the first conductive layers, wherein undercuts are formed under the first conductive layers and each of the first conductive layers includes the first region covered by the first insulating layer located thereover and a second region extending from the first region, contact pads coupled to the second regions of the respective first conductive layers, and a liner layer formed on the pads and filling the undercuts.

A semiconductor device according to an embodiment of the present invention may include a stacked structure having first conductive layers stacked stepwise and first insulating layers interposed between the first conductive layers, wherein the stacked structures includes a stepped sidewall, and contact pads formed over the first conductive layers exposed on the sidewall of the stacked structure, wherein each of the contact pads includes one or more second conductive layers and one or more second insulating layers stacked alternately.

A semiconductor device according to an embodiment of the present invention may include a stacked structure having first conductive layers stacked stepwise and first insulating layers interposed between the first conductive layers, wherein each of the first conductive layers includes the first region covered by the first insulating layer located thereover and a second region extending from the first region, contact pads coupled to the second regions of the respective first conductive layers, and a liner layer formed on the contact pads and interposed under the respective first conductive layers of the second region.

DETAILED DESCRIPTION

Figure 1A:
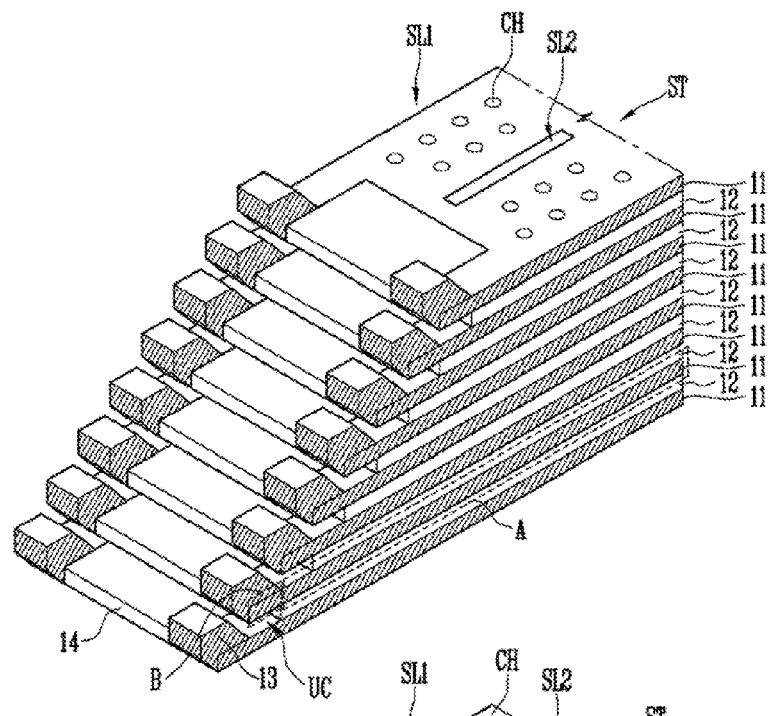
FIGS. 1A and 1B illustrate perspective views of a structure of a semiconductor device according to an embodiment of the present invention.

Various embodiments of the present disclosure will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the thicknesses and length of components are exaggerated for convenience of illustration. In the following description, a detailed explanation of known related functions and constitutions may be omitted to avoid unnecessarily obscuring the subject matter of the present invention. Like reference numerals refer to like elements throughout the specification and drawings.

Furthermore, 'connected/coupled'0 represents that one component is directly coupled to another component or indirectly coupled through another component, possibly through an intermediate component. In this specification, the singular form may include a plural form, and vice versa, so long as it is not specifically mentioned. Furthermore, 'include/comprise' or 'including/comprising' used in the specification represents that one or more components, steps, operations, and elements exist or are added.

It should be readily understood that the meaning of "on" and "over" in the present disclosure should be interpreted in the broadest manner so that "on" means not only "directly on" but also "on" something with an intermediate feature(s) or a layer(s) therebetween, and that "over" means not only directly on top but also on top of something with an intermediate feature(s) or a layer(s) therebetween.

Figure 1B:
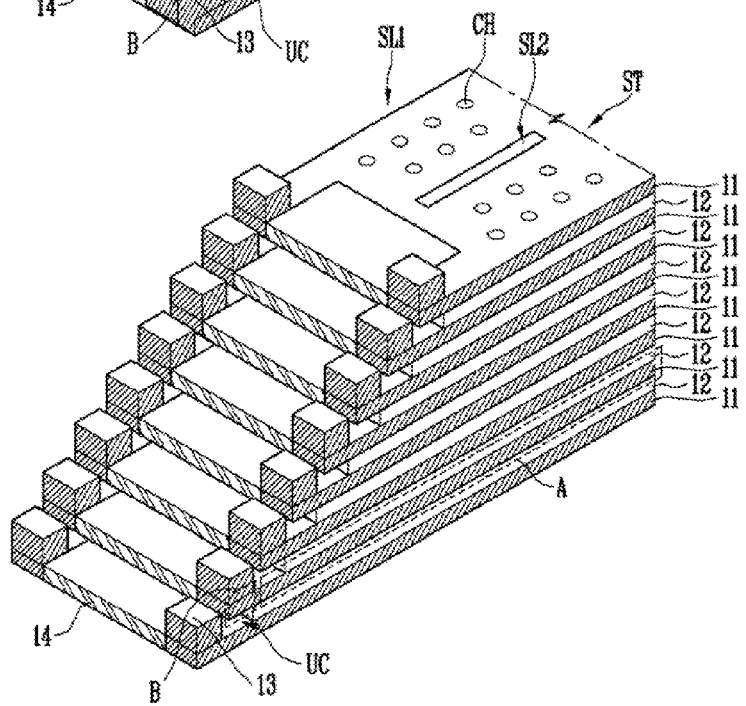

FIGS. 1A and 1B illustrate perspective views of the configuration of a semiconductor device according to an embodiment of the present invention.

As illustrated in FIGS. 1A and 1B, a semiconductor device according to an embodiment may include stacked structures ST having stepped sidewalls. Each of the stacked structures ST may include conductive layers 11 stacked stepwise and insulating layers 12 interposed between the conductive layers 11. The conductive layers 11 may be gate electrodes of selection transistors, memory cells and the like. In FIGS. 1A and 1B, one of the stacked structures ST is illustrated for convenience of illustration.

Each of the conductive layers 11 may include a first region A covered by the conductive layer 11 located thereover and a second region (or a contact region) B extending from the first region A. The second regions B may be exposed on the stepped sidewalls of the structures ST. Pads (or contact pads) 13 may be coupled to the second regions B of the conductive layers 11. Each of the pads 13 may extend from a top surface of each of the conductive layers 11 in a diagonal direction (see FIG. 1A) or in a direction perpendicular to the top surface of each of the conductive layers 11 (see FIG. 1B). For example, the pads 13 and the conductive layers 11 may be connected as a single layer or different layers. In addition, though not Illustrated in FIGS. 1A and 1B, an insulating layer may be interposed between the pads 13 and the conductive layers 11. In another example, at least one conductive layer and at least one insulating layer on which the pads 13 are alternately stacked may be included.

Undercuts UC may be located under the second regions B of the conductive layers 11 of the stacked structures ST. Contact plugs (not illustrated) are to be contacted in the second regions B. Therefore, the conductive layers 11 may protrude more than the insulating layers 12. The undercuts UC may extend between the stacked pads 13 and be filled with a liner layer (not illustrated).

First slits SL1 may be located between the stacked structures ST. In addition, each of the stacked structures ST may further include sacrificial layers 14 that are coupled to the conductive layers 11 and arranged in a central region separated from the first slit SL1. Thus, the conductive layers 11 may be located on the sidewall of the stacked structure ST exposed through the first slit SL1, i.e., in an edge region thereof, and the sacrificial layers 14 may be located in the central region of the stacked structure ST.

In addition, the semiconductor device may further include at least one second slit SL2 that passes through the stacked structure ST and channel layers CH. The first and second slits SL1 and SL2 may be filled with insulating layers.

Figure 2A:
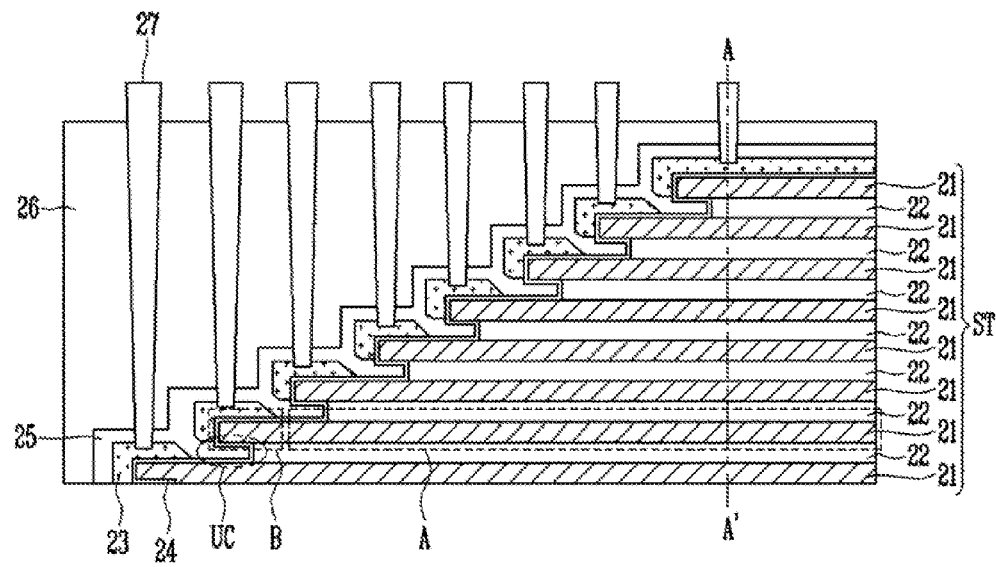
FIGS. 2A to 2F illustrate cross-sectional views of a structure of a semiconductor device according to an embodiment of the present invention.
Figure 2B:
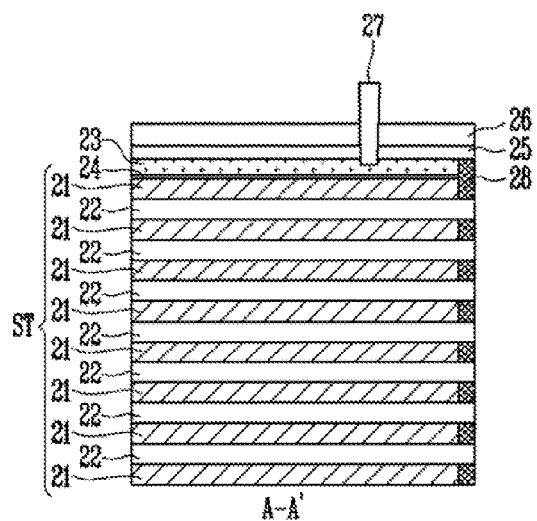

FIGS. 2A to 2F illustrate cross-sectional views of the configuration of a semiconductor device according to an embodiment of the present invention. FIG. 2B is a cross-sectional view taken along A-A'.

As illustrated in FIGS. 2A to 2F, the stacked structure ST may include first conductive layers 21 and first insulating layers 22 that are alternately stacked. The undercuts UC may be formed under the second regions B of the first conductive layers 21. Pads (or contact pads) 23 may be coupled to the second regions of the first conductive layers 21. The undercuts UC may extend between the pads 23.

The pads 23 may include the same or different materials from the first conductive layers 21. For example, the pads 23 and the first conductive layers 21 may include metal layers. In another example, the pads 23 and the first conductive layers 21 may include polysilicon layers. In yet another example, the first conductive layers 21 may include polysilicon layers and the pads 23 may include metal layers, or the first conductive layers 21 may include metal layers, and the pads 23 may include polysilicon layers.

In addition, a liner layer 25 may be formed on entire surfaces of the pads 23 and fill the undercuts UC formed under the pads 23. An interlayer insulating layer 26 may be formed over the liner layer 25. For example, the liner layer 25 and the Interlayer insulating layer 26 may include oxide layers. Contact plugs 27 may pass through the Interlayer insulating layer 26 and the liner layer 25 and be coupled to the pads 23.

As described above, since the pads 23 are additionally formed on the exposed ends (the second regions B) of the first conductive layers 21, the contact plugs 27 may be prevented from passing through the first conductive layers 21 and being coupled thereto. In addition, since the undercuts UC are formed under the first conductive layers 21, a sufficient space may be ensured between the pads 23 adjacent in the vertical direction. Therefore, even when the thickness of the pads 23 is increased, the pads 23 may be prevented from being bridged.

FIGS. 2A and 2B illustrate an example in which the pads 23 extend in a diagonal direction and a second insulating layer 24 is interposed between the pads 23 and the first conductive layers 21.

The second insulating layer 24 may be an oxide layer formed through oxidation. Therefore, when the first conductive layers 21 and the pads 23 are electrically insulated from each other by the second insulating layer 24, the first conductive layers 21 and the pads 23 may be electrically coupled by coupling patterns 28 formed on the sidewalls of the stacked structures ST (see FIGS. 1A and 1B). For example, the first conductive layer 21, the second insulating layer 24 and the pad 23, exposed through the first slit SL1 located between the stacked structures ST, may include grooves, and the coupling patterns 28 may be formed in the grooves. In addition, the coupling patterns 28 may include a silicide layer.

For example, the contact plug 27 may pass through the pad 23 and the second insulating layer 24 and contact the first conductive layer 21. In this example, the coupling patterns 28 may not be formed.

Figure 2C:
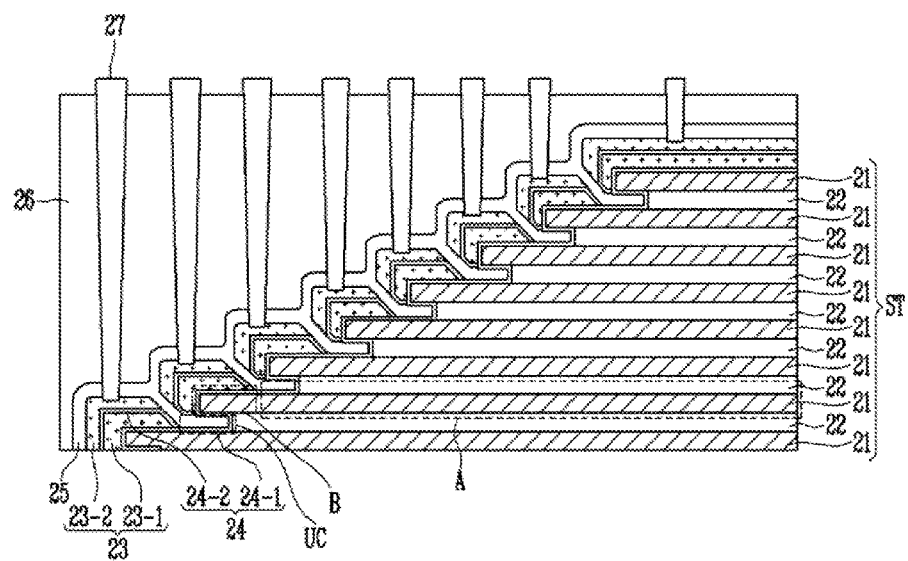

FIG. 2C illustrates an embodiment in which the pads 23 extend in the diagonal direction and the pads 23 and the second insulating layers 24 are alternately stacked. For example, each of the pads 23 may include a 2-1$^{st}$ insulating layer 24-1, a 2-1$^{st}$ conductive layer 23-1, a 2-2$^{nd}$ Insulating layer 24-2, and a 2-2$^{nd}$ conductive layer 23-2 that are sequentially stacked. The 2-1st insulating layer 24-1 may be formed on a surface of the second region B of the first conductive layer 21. The 2-1$^{st}$ conductive layer 23-1 may surround a top surface and a sidewall of the first conductive layer 21 with the 2-1$^{st}$ insulating layer 24-1 interposed therebetween. The 2-2$^{nd}$ insulating layer 24-2 may be formed on a surface of the 2-1$^{st}$ conductive layer 23-1. In addition, the 2-2$^{nd}$ conductive layer 23-2 may surround a top surface and a sidewall of the 2-1$^{st}$ conductive layer 23-1 with the 2-2$^{nd}$ insulating layer 24-2 interposed therebetween.

Additionally, when the first conductive layers 21 and the pads 23 are electrically insulated from each other by the second insulating layers 24, the first conductive layers 21 and the pads 23 may be coupled to each other by coupling patterns as described above with reference to FIG. 2B.

Figure 2D:
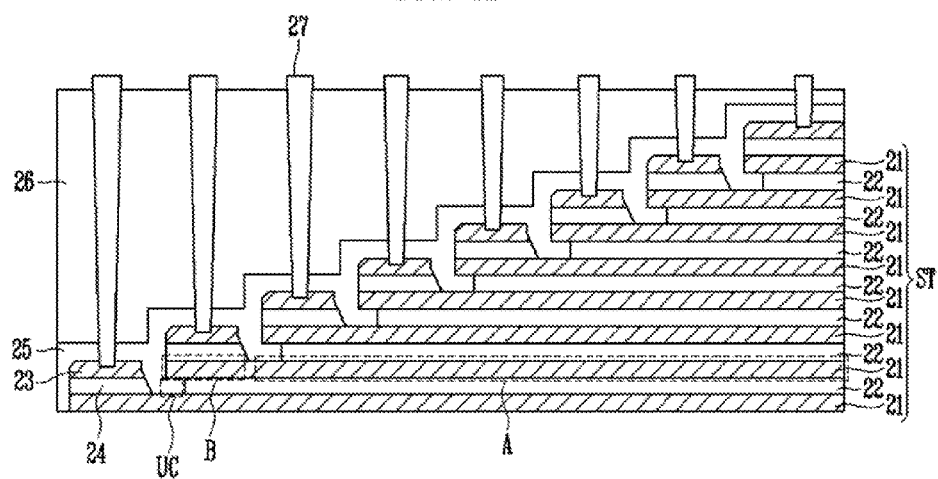

FIG. 2D illustrates an embodiment in which the pads 23 extend in a direction perpendicular to the first conductive layers 21 and the second insulating layers 24 are interposed between the pads 23 and the first conductive layers 21. For example, the second insulating layer 24 may be formed on the second region B of the first conductive layer 21, and the pad 23 may be formed on the second insulating layer 24. When the first conductive layer 21 and the pad 23 are electrically insulated from each other by the second insulating layer 24, the first conductive layer 21 and the pad 23 may be coupled to each other by the coupling pattern 28 as described above with reference to FIG. 2B.

Figure 2E:
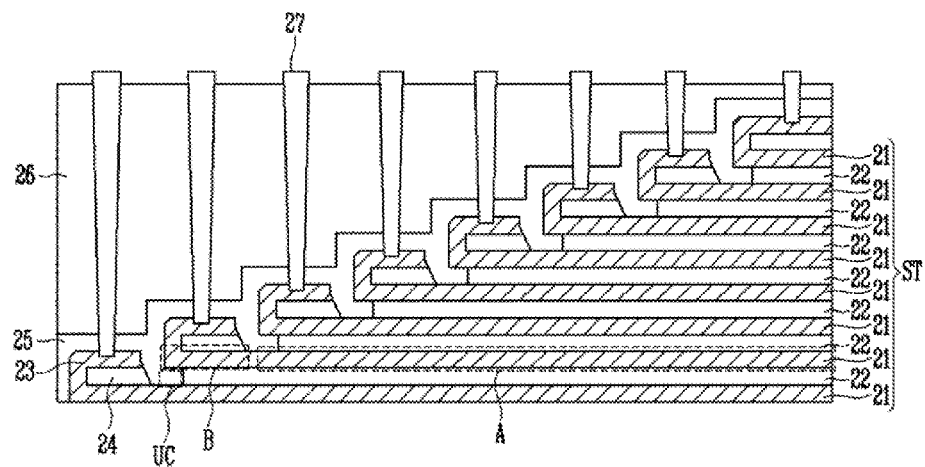

FIG. 2E illustrates an embodiment in which the pads 23 extend in the direction perpendicular to the first conductive layers 21 and the second insulating layers 24 are interposed between the pads 23 and the first conductive layers 21. For example, the second insulating layer 24 may be formed on the second region B of the first conductive layer 21. In addition, each of the pads 23 may surround the top surface and the sidewall of each of the second insulating layers 24 and contact each of the first conductive layers 21.

Figure 2F:
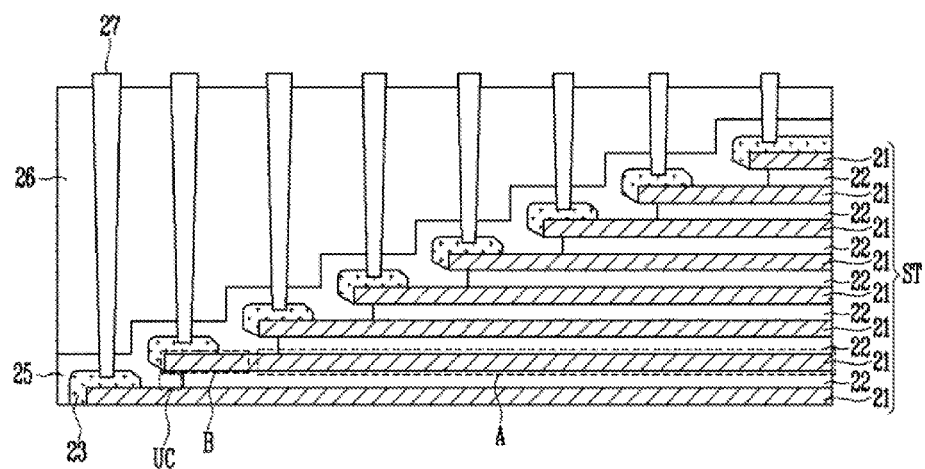

FIG. 2F illustrates an embodiment in which the pads 23 directly contact the first conductive layers 21. For example, each of the pads 23 may surround the top surface and the sidewall of each of the second regions B of the first conductive layers 21. The first conductive layers 21 and the pads 23 may directly contact and be electrically connected to each other.

Figure 3A:
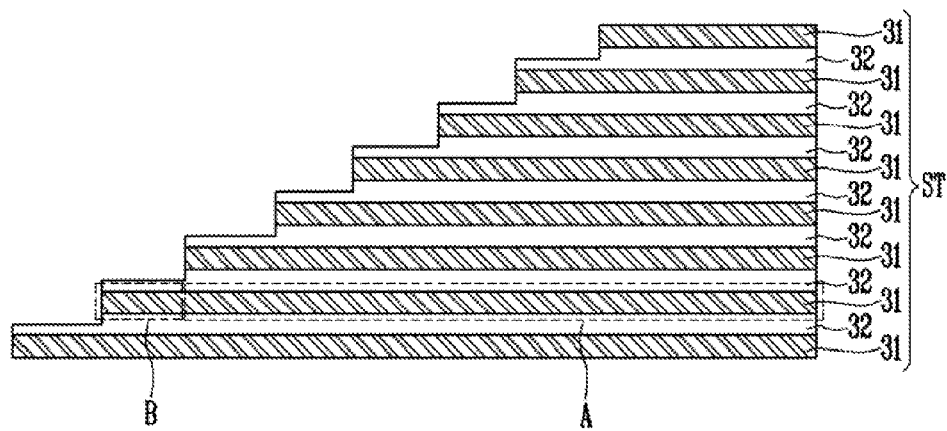
FIGS. 3A to 3J illustrate cross-sectional views of a process flow for a method of manufacturing a semiconductor device according to an embodiment of the present invention.
Figure 3B:
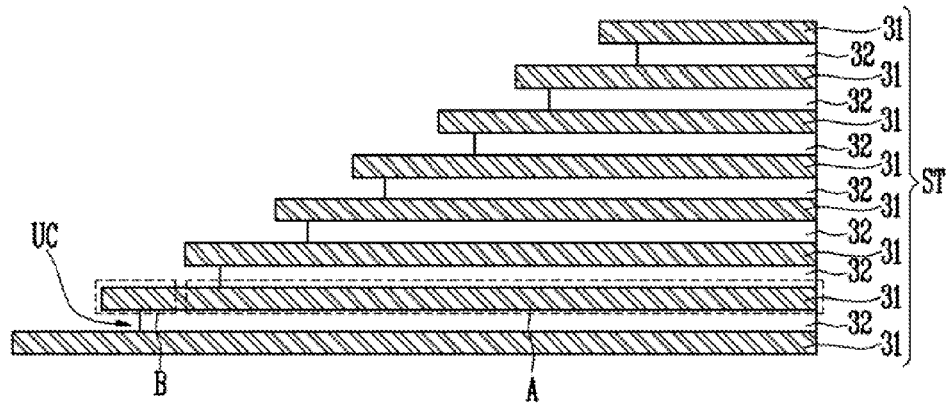
Figure 3C:
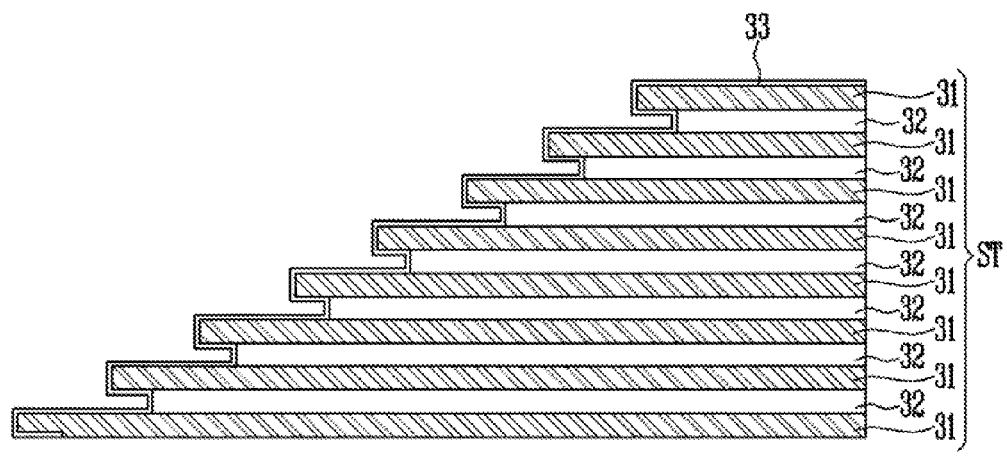
Figure 3D:
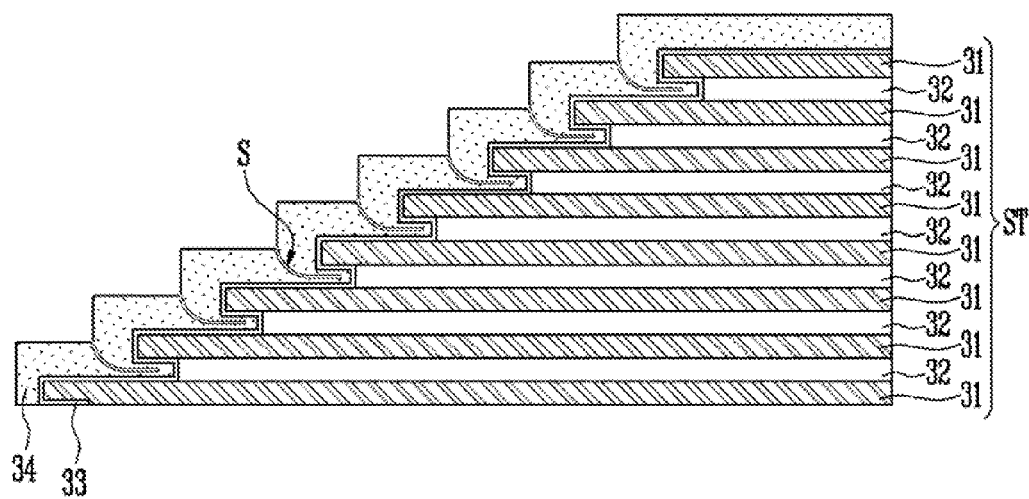
Figure 3E:
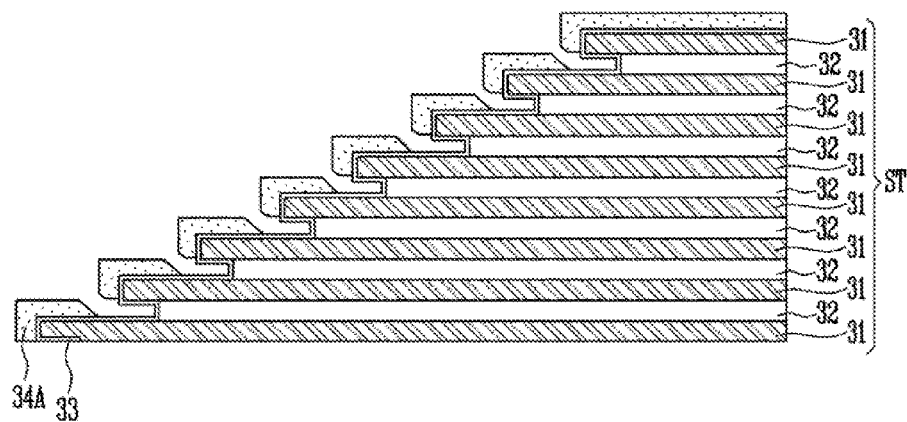
Figure 3F:
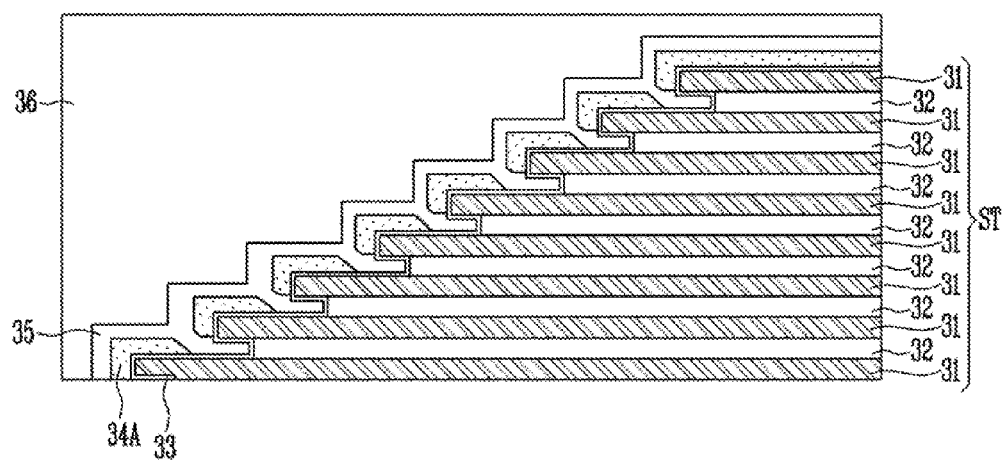
Figure 3G:
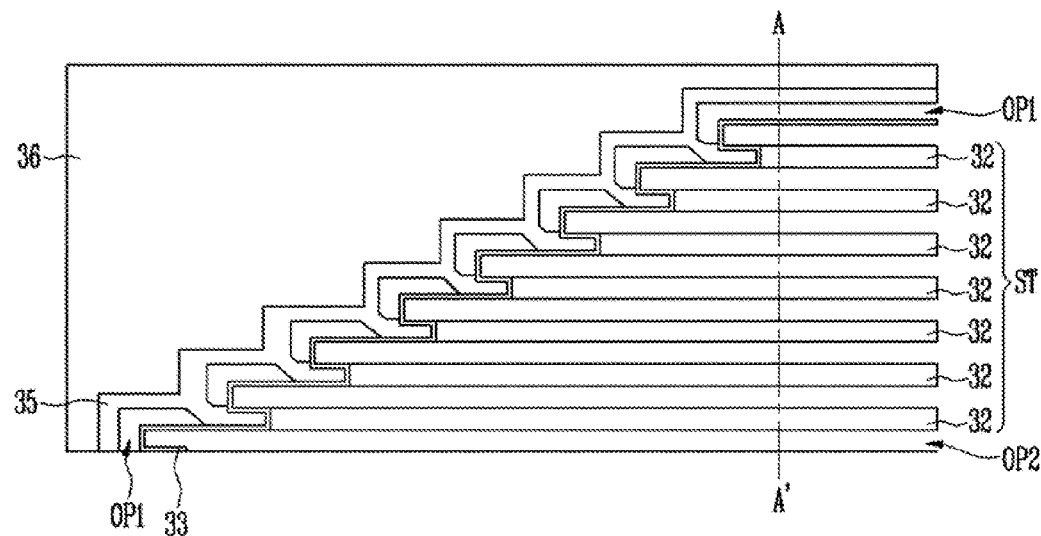
Figure 3H:
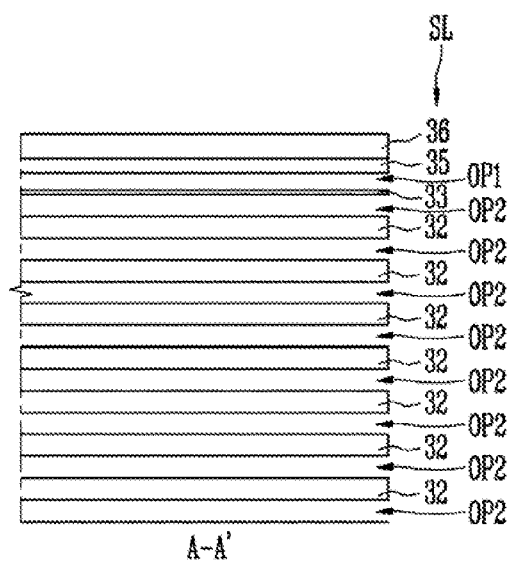

FIGS. 3A to 3J illustrate cross-sectional views of a process flow for a method of manufacturing a semiconductor device according to an embodiment of the present invention. FIG. 3H illustrates a cross-sectional view taken along A-A' of FIG. 3G. FIG. 33 illustrates a cross-sectional view taken along A-A' of FIG. 3A.

As Illustrated in FIG. 3A, first material layers 31 and second material layers 32 may be alternately formed. The first material layers 31 may be stacked to form gate electrodes of selection transistors, memory cells and the like. The second material layers 32 may be stacked to form insulating layers that electrically insulate stacked conductive layers from each other.

The first material layers 31 may include a material having a high etch selectivity with respect to the second material layers 32. For example, the first material layers 31 may include a sacrificial layer including a nitride, and the second material layers 32 may include an insulating layer including an oxide. In another example, the first material layers 31 may include a conductive layer having polysilicon, and the second material layers 32 may include an insulating layer having an oxide. According to this embodiment, a description will be made in reference to an example in which the first material layers 31 include a sacrificial layer and the second material layers 32 include an insulating layer.

Subsequently, a sidewall of the stacked structure ST may be stepped. For example, the sidewall of the stacked structure ST may be patterned so that at least one first material layer 31 and at least one second material layer 32 may form a single layer. Each step of the stepped sidewall may include the upper second material layer 32 and the lower first material layer 31. In addition, the upper second material layer 32 may be etched by a predetermined thickness during a patterning process.

Thus, the stacked structure ST that includes the first material layers 31 stacked stepwise and the second material layers 32 interposed therebetween may be formed. Each of the first material layers 31 may include the first region A covered by the upper first material layer 31 and the second region B extending from the first region A. In addition, the second material layer 32 may cover both of the first and second regions A and B or only the first region A of the first material layer 31 located thereunder.

As Illustrated in FIG. 3B, the second material layers 32, exposed on the sidewall of the stacked structure ST, may be etched to form the undercuts UC under the first material layers 31. For example, the second material layers 32 may be selectively etched by a wet etch process. As a result, the first material layers 31 may protrude more than the second material layers 32 and the undercuts UC may be formed under the second region B of the first material layers 31.

As illustrated in FIG. 3C, an insulating layer 33 may be formed on surfaces of the first material layers 31 exposed on the sidewall of the stacked structure ST. The insulating layer 33 may have a smaller thickness than the first and second material layers 31 and 32 and may not completely fill the undercuts UC. For example, the insulating layer 33 may be formed by oxidizing surfaces of the first material layers 31 by a predetermined thickness through an oxidation process. In another example, the insulating layer 33 may be formed on the surfaces of the first material layers 31 and the second material layers 32 by a deposition process.

As described above with reference to FIG. 2F, when a pad directly contacts a gate conductive layer, the process of forming the insulating layer 33 may be omitted.

As illustrated in FIG. 3D, a third material layer 34 may be formed on the insulating layer 33. The third material layer 34 may be formed to have a sufficient thickness in consideration of the target thickness of the pads and a thickness of the third material layer 34 to be etched during a subsequent etch processes.

The third material layer 34 may be formed on the surfaces of the first material layers 31 exposed on the sidewall of the stacked structure ST and may also be formed in the undercuts UC. Here, the undercuts UC may not be completely filled and a seam S may be formed therein. The seam S may refer to a space created when the third material layer 34 is formed in the undercuts UC having a relatively small width. The seam S may be a narrow space and extend from the exterior into the undercuts UC. For example, the third material layer 34 may be formed by vapor deposition having poor step coverage, such as Low Pressure Chemical Vapor Deposition (LPCVD) and Plasma Enhanced Chemical Vapor Deposition (PECVD).

The third material layer 34 may include the same material as the first material layers 31. For example, the third material layer 34 and the first material layers 31 may include a sacrificial layer such as a nitride layer. In another example, the third material layer 34 may include a material having a high etch selectivity with respect to the first material layers 31. For example, the third material layer 34 may include a sacrificial layer, such as a nitride layer, and the first material layers 31 may include a conductive layer, such as a doped polysilicon layer.

As Illustrated in FIG. 3E, the third material layer 34 may be etched to form third material patterns 34A. For example, the third material patterns 34A may be formed by removing the third material layer 34 formed in the undercuts UC by a wet etch process. When the third material layer 34 is etched, the thickness of the third material layer 34 may be controlled so that upper and lower third material patterns 34A may not be connected and may not be penetrated during subsequent processes of forming the contact plugs. Therefore, the third material patterns 34A may be coupled to the first material layers 31 exposed on the sidewall of the stacked structure ST and extend from top surfaces of the first material layers 31 in the diagonal direction.

As illustrated in FIG. 3F, a liner layer 35 may be formed on entire surfaces of the third material patterns 34A and fill the undercuts UC, and an interlayer insulating layer 36 may be subsequently formed over the liner layer 35. For example, the liner layer 35 and the interlayer insulating layer 36 may include an insulating layer such as an oxide layer.

As Illustrated in FIGS. 3G and 3H, the slit SL may be formed through the stacked structure ST. Subsequently, the third material patterns 34A, exposed through the slit SL, may be removed to form first openings OP1, and the first material layers 31 may be removed to form second openings OP2.

Though not illustrated in FIGS. 3G and 3H, the first material layers 31 may not be completely removed from the stacked structure. For example, as described above with reference to FIGS. 1A and 1B, only the first material layers 31 adjacent to the edge region adjacent to the slit SL may be removed, and the first material layers 31 in the central region may remain.

In addition, processes may be changed depending on materials of the first material layers 31 and the third material patterns 34A. For example, when the first material layers 31 and the third material patterns 34A include the same material (for example, sacrificial layer), the first openings OP1 and the second openings OP2 may be formed at the same time. In another example, when the first material layers 31 include a conductive layer, and the third material patterns 34A include a sacrificial layer, only the first openings OP1 may be formed. In yet another example, when the first material layers 31 include a sacrificial layer, and the third material patterns 34A include a conductive layer such as polysilicon, only the second openings OP2 may be formed.

Figure 3I:
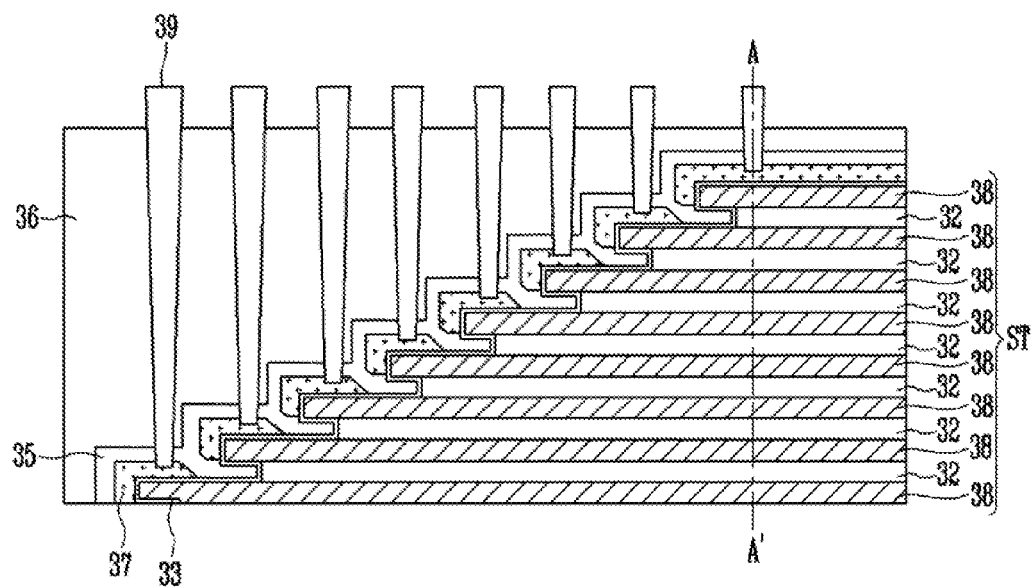
Figure 3J:
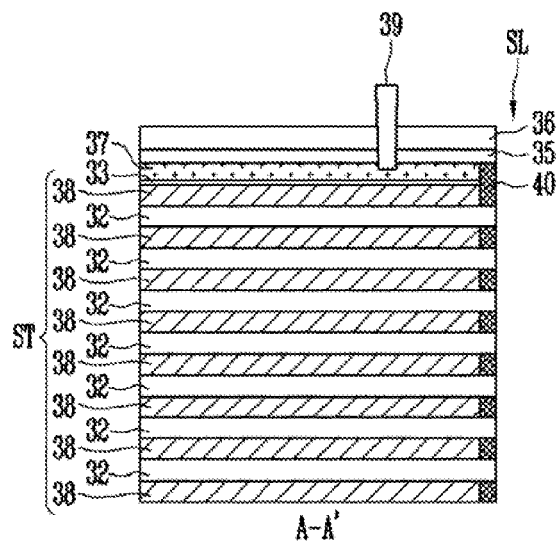

As Illustrated in FIGS. 3I and 3J, conductive layers may be formed in the first and second openings OP1 and OP2. For example, second conductive layers (i.e., contact pads) 37 may be formed in the first openings OP1, and first conductive layers 38 may be formed in the second openings OP2. The first conductive layers 38 and the second conductive layers 37 may be formed simultaneously or separately. In addition, the first conductive layers 38 and the second conductive layers 37 may include the same or different materials. For example, the first and second material layers 38 and 37 may include a metal layer such as tungsten.

Subsequently, contact plugs 39 may be formed through the interlayer insulating layer 36 and the liner layer 35 and coupled to the second conductive layers 37. The contact plugs 39 may be arranged in a zigzag pattern. In addition, the contact plugs 39 may be formed at the same time or through a different process, depending on depths thereof.

Subsequently, grooves may be formed by etching the conductive layers 38, the insulating layer 33 and the contact pads 37, exposed through the slit SL, by a predetermined thickness. For example, when both the insulating layer 33 and the second material layer 32 include insulating layers, the insulating layer 33 may be formed using a material having a higher etch rate than the second material layer 32, so that grooves may be selectively formed in the insulating layer 33. Subsequently, coupling patterns 40 may be formed in the grooves.

Before the first and second material layers 38 and 37 are formed, the second insulating layer 33 existing between the first openings OP1 and the second openings OP2 may be removed, so that the first opening OP1 and the second opening OP2 may be coupled to each other. Thus, the process of forming the coupling patterns 40 may be omitted.

According to the above-described processes, contact pads may be easily formed on ends of stacked gate electrodes by using the undercuts UC. Therefore, by selectively increasing the thickness of the ends of the gate electrodes, the gate electrodes may be prevented from being penetrated and bridged when the contact plugs 39 are formed. In addition, since the first and second material layers 38 and 37, formed at the ends of the gate electrodes, prevent a punch phenomenon, the stacked gate electrodes may be prevented from being coupled to each other.

The above-described processes may be partly changed depending on types of the first, second and third material layers 31, 32 and 34. For example, the first material layers 31 may include a conductive layer such as polysilicon, the second material layers 32 may include an insulating layer, and the third material layers 34 may include a sacrificial layer such as a nitride layer. In this example, the process of forming the insulating layer 33 may be omitted. In addition, after the slit is formed, only the first openings OP1 may be formed. Subsequently, the same or different conductive layers from the first material layers 31 may be formed in the first openings OP1. When the first material layers 31 and the second conductive layers 37 include a polysilicon layer, the coupling patterns 40 may include a silicide layer. In another example, the first material layers 31 may include a polysilicon layer, and the second conductive layers 37 may include a metal layer.

A description will be made in reference to another example in which the first and third material layers 31 and 34 include conductive layers such as polysilicon and the second material layers 32 include insulating layers. In this example, after a slit is formed, the first and third material layers 31 and 34, exposed through the slit, may be silicided. In addition, the processes of forming the first and second openings OP1 and OP2 may be omitted.

Figure 4A:
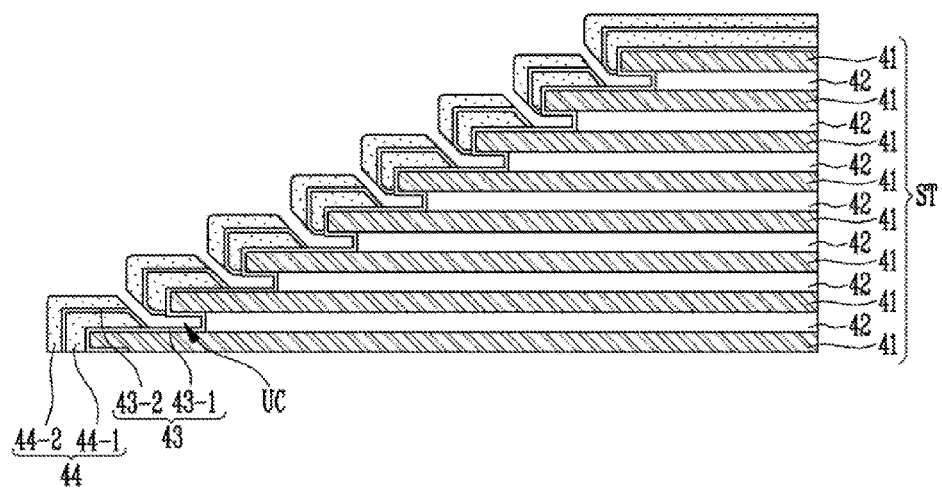
FIGS. 4A to 4D illustrate cross-sectional views of a process flow for a method of manufacturing a semiconductor device according to an embodiment of the present invention.
Figure 4B:
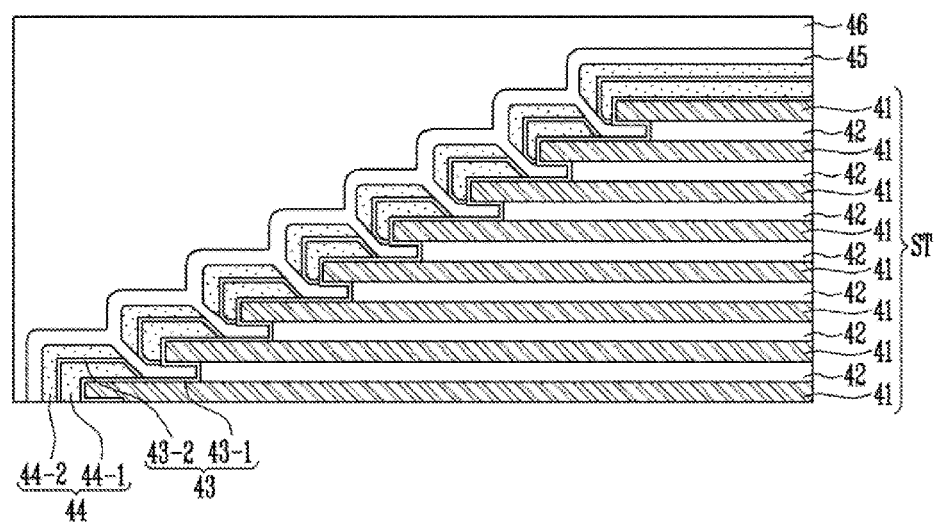
Figure 4C:
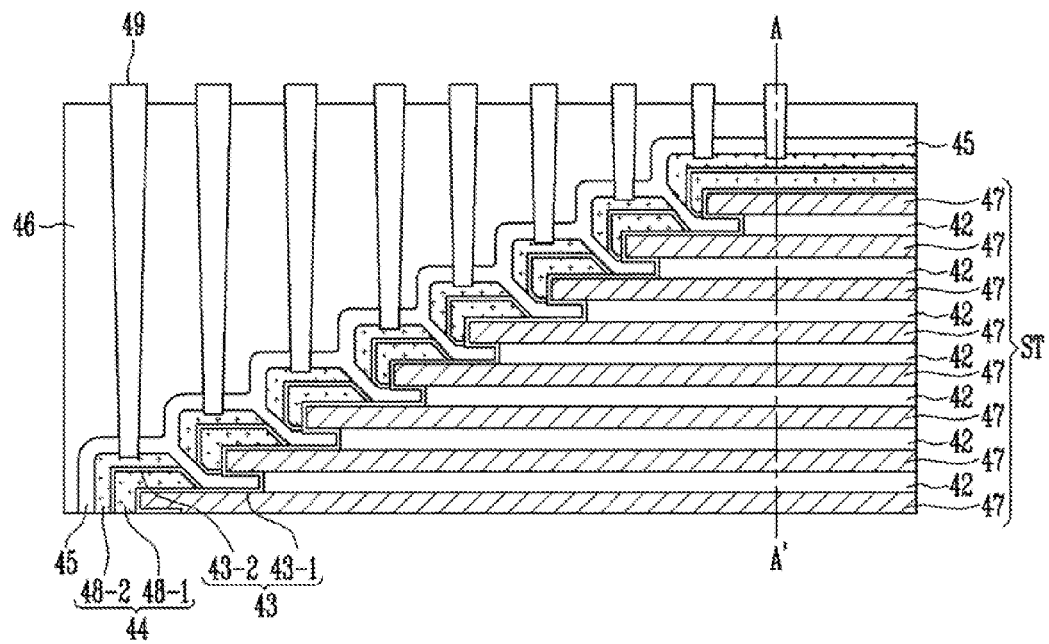
Figure 4D:
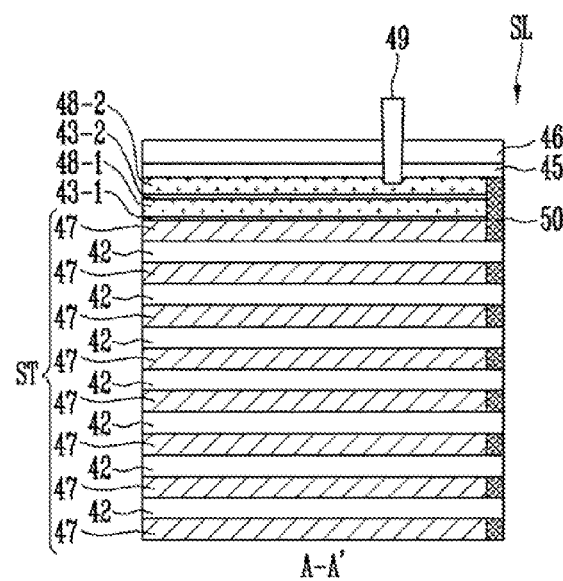

FIGS. 4A to 4D illustrate cross-sectional views of a process flow for a method of manufacturing a semiconductor device according to an embodiment of the present invention. FIG. 4D illustrates a cross-sectional view taken along A-A' of FIG. 4C. Hereinafter, a description of common contents with the earlier described embodiments is omitted.

As illustrated in FIG. 4A, first material layers 41 and second material layers 42 may be alternately stacked to form a stacked structure ST, and a sidewall of the stacked structure ST may be stepped. Subsequently, the second material layers 42, exposed on the sidewall of the stacked structure ST, may be etched to form the undercuts UC under the first material layers 41, and a 1-1$^{st}$ insulating layer 43-1 may be formed on surfaces of the first material layers 41 exposed on the sidewall of the stacked structure ST. Subsequently, a 3-1$^{th}$ material layer may be formed on the 1-1$^{st}$ insulating layer 43-1, and the 3-1$^{st}$ material layer formed in the undercuts UC may be removed to form 3-1$^{st}$ material patterns 44-1.

Subsequently, a 1-2$^{nd}$ insulating layer 43-2 may be formed on surfaces of the 3-1$^{st}$ material patterns 44-1. For example, the surfaces of the 3-1$^{st}$ material patterns 44-1 may be oxidized by a predetermined thickness to form the 1-2$^{nd}$ insulating layer 43-2. Subsequently, a 3-2$^{nd}$ material layer may be formed on the 1-2$^{nd}$ insulating layer 43-2, and the 3-2$^{nd}$ material layer formed in the undercuts UC may be removed to form 3-2$^{nd}$ material patterns 44-2.

As illustrated in FIG. 4B, a liner layer 45 may be formed on entire surfaces of the 3-2$^{nd}$ material patterns 44-2 and fill the undercuts UC, and an interlayer insulating layer 46 may be formed on the liner layer 45.

As illustrated in FIGS. 4C and 4D, after the slit SL may be formed through the first and second material layers 41 and 42, the first material layers 41, the 3-1$^{st}$ material patterns 44-1 and the 3-2$^{nd}$ material patterns 44-2 may be removed through the slit SL to form openings. For example, 1-1$^{st}$ openings may be formed by removing the 3-1$^{st}$ material patterns 44-1, 1-2$^{nd}$ openings may be formed by removing the 3-2$^{nd}$ material patterns 44-2, and second openings may be formed by removing the first material layers 41.

Subsequently, conductive layers may be formed in the openings. For example, 1-1$^{st}$ conductive layers 48-1 may be formed in the 1-1$^{st}$ openings, 1-2$^{nd}$ conductive layers 48-2 may be formed in the 1-2$^{nd}$ openings, and second conductive layers 47 may be formed in the second openings. As a result, pads may include the 1-1$^{st}$ insulating layer 43-1, the 1-1$^{st}$ conductive layer 48-1, the 1-2$^{nd}$ insulating layer 43-2 and the 1-2$^{nd}$ conductive layer 48-2 that are sequentially stacked. In addition, these pads may be coupled to the second conductive layers 47 exposed on the sidewall of the stacked structure ST.

Subsequently, contact plugs 49 may be formed through the interlayer insulating layer 46 and the liner layer 45 and coupled to the pads. Thereafter, grooves may be formed by etching the second conductive layers 47, the 1-1$^{st}$ insulating layers 43-1, the 1-1$^{st}$ conductive layers 48-1, the 1-2$^{nd}$ insulating layers 43-2 and the 1-2$^{nd}$ conductive layers 48-2, exposed through the slit SL, by a predetermined thickness, and coupling patterns 50 may be formed in the grooves.

According to the above-described processes, pads that include conductive layers and insulating layers stacked alternately may be formed. Therefore, the thickness of the pads may be selectively increased. In addition, the pads may be formed by alternately stacking two material layers having a high etch selectivity with respect to each other, so that the pads may be effectively prevented from being penetrated when the contact plugs 49 are formed.

Figure 5A:
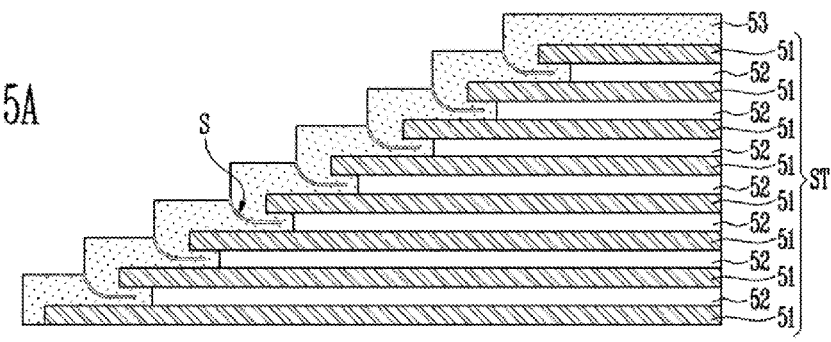
FIGS. 5A to 5G illustrate cross-sectional views of a process flow for a method of manufacturing a semiconductor device according to an embodiment of the present invention.
Figure 5B:
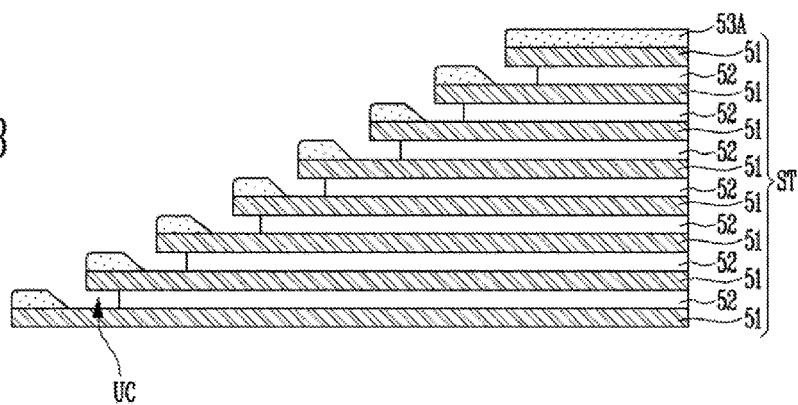
Figure 5C:
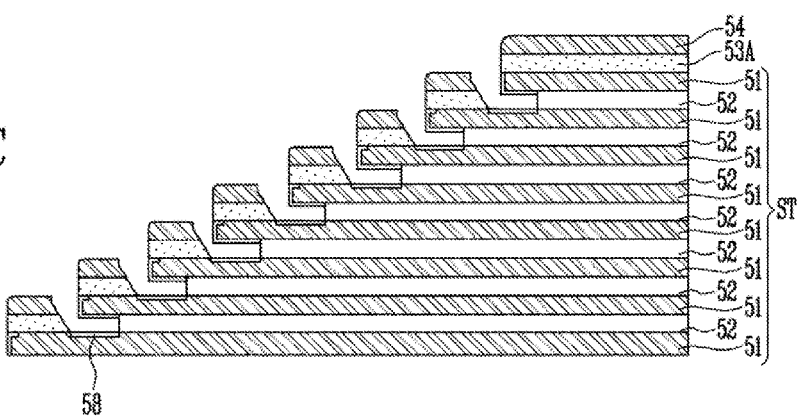
Figure 5D:
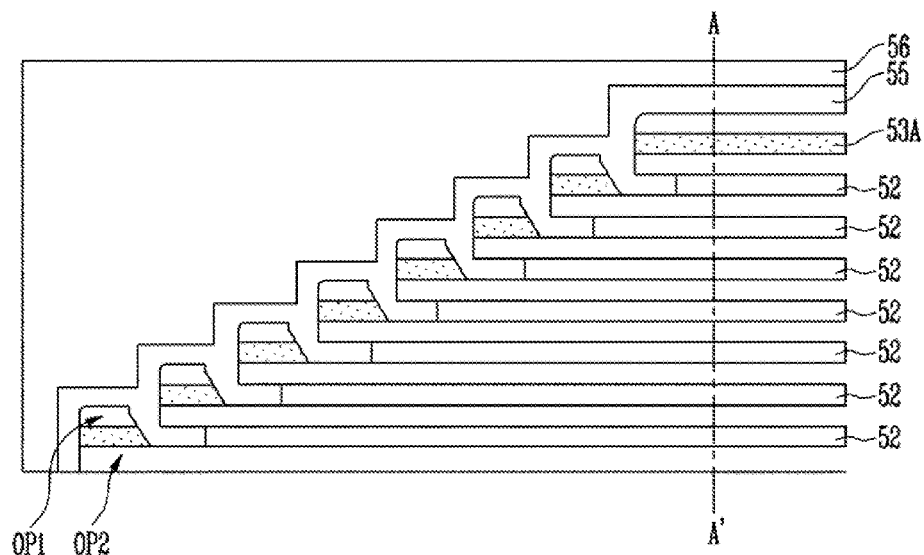
Figure 5E:
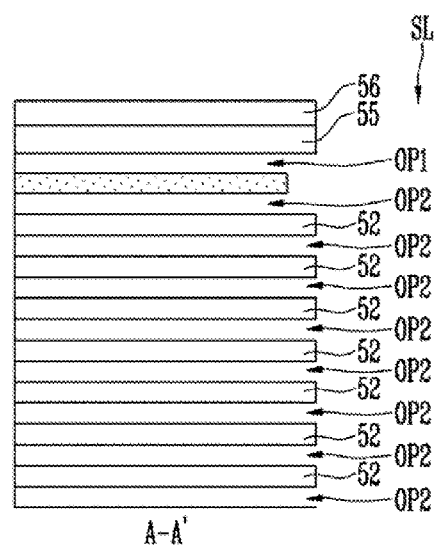
Figure 5F:
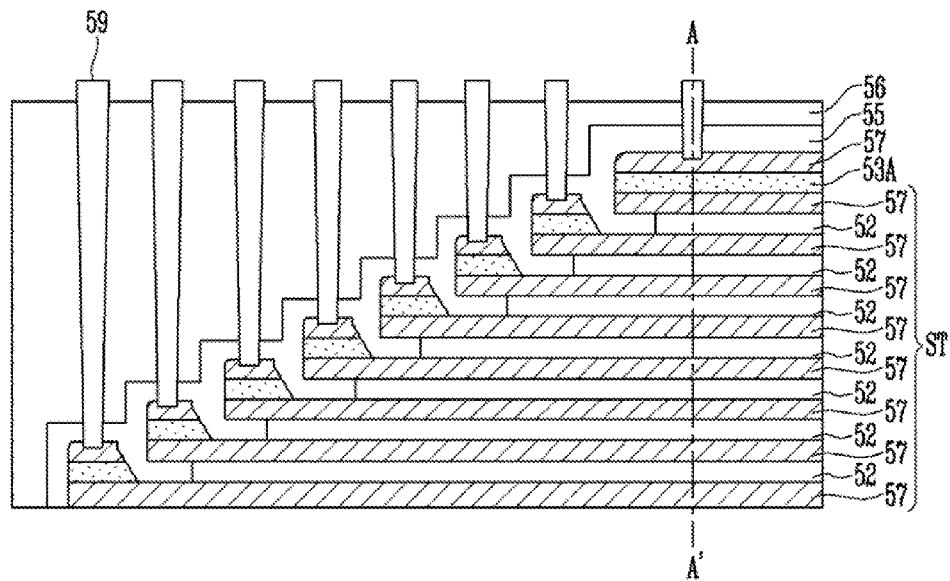
Figure 5G:
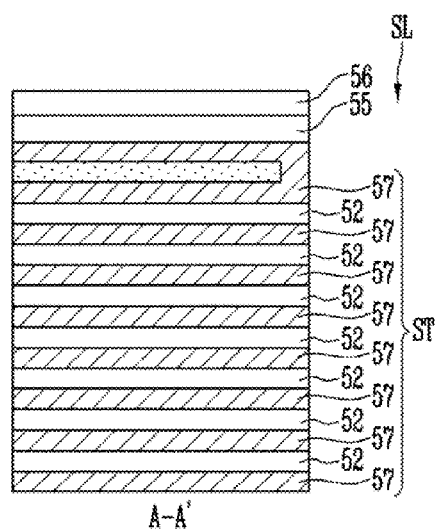

FIGS. 5A to 5G illustrate cross-sectional views of a process flow for a method of manufacturing a semiconductor device according to an embodiment of the present invention. FIG. 5E illustrates a cross-sectional view taken along A-A' of FIG. 5D. FIG. 5G illustrates a cross-sectional view of A-A' of FIG. 5F. Hereinafter, a description of common contents with the earlier described embodiments is omitted.

As illustrated in FIG. 5A, first material layers 51 and second material layers 52 may be alternately stacked to form the stacked structure ST, and a sidewall of the stacked structure ST may be stepped. Subsequently, the second material layers 52, exposed on the sidewall of the stacked structure ST, may be etched to form the undercuts UC under the first material layers 51, and an Insulating layer 53 may be formed on surfaces of the first material layers 51 exposed on the sidewall of the stacked structure ST. More specifically, the insulating layer 53 including the seam S may be formed in the undercuts UC.

As illustrated in FIG. 5B, the insulating layer 53, formed in the undercuts UC, may be removed to form insulating patterns 53A. The insulating patterns 53A may be formed over the first material layers 51 exposed on the sidewall of the stacked structure ST. In addition, the Insulating patterns 53A and the first material layers 51 may have the same or different thicknesses.

As illustrated in FIG. 5C, a second insulating layer 58 may be formed on the first material layers 51 exposed on the sidewall of the stacked structure ST. For example, the second insulating layer 58 may be an oxide layer formed by oxidizing surfaces of the first material layers 51 by a predetermined thickness.

Subsequently, a third material layer may be formed on surfaces of insulating patterns 53A and fill the undercuts UC. Subsequently, third material patterns 54 may be formed by removing the third material layer formed in the undercuts UC. Since the exposed first material layers 51 are protected by the second insulating layer 58, the first material layers 51 may not be damaged when the third material layer is removed. In addition, the third material patterns 54 and the insulating patterns 53A may have the same or different thicknesses.

As illustrated in FIGS. 5D and 5E, a liner layer 55 may be formed on surfaces of the third material patterns 54 and fill the undercuts UC, and subsequently, an interlayer insulating layer 56 may be formed on the liner layer 55. Subsequently, the slit SL may be formed through the stacked structure ST, and the third material patterns 54 and the first material layers 51 may be removed through the slit SL to form the first openings OP1 and the second openings OP2. The first openings OP1 from which the third material patterns 54 are removed and the second openings OP2 from which the first material layers 51 are removed may be separated from each other.

Subsequently, the insulating patterns 53A, exposed through the slit SL, may be etched by a predetermined thickness. At this time, the second insulating layer 58 may also be removed. For example, the insulating patterns 53A may be selectively etched by a wet etch process. As a result, the first openings OP1 and the second openings OP2 may be connected to each other.

As illustrated in FIGS. 5F and 5G, conductive layers 57 may be formed in the first and second openings OP1 and OP2 through the slit SL. The conductive layers 57 may be formed as a single layer in the first opening OP1 and the second opening OP2 that are connected to each other. Subsequently, contact plugs 59 may be formed through the interlayer insulating layer 56 and the liner layer 55 and coupled to the conductive layers 57.

According to the above-described processes, a pad and a conductive layer configured as a gate electrode may be connected as a single layer. Therefore, it may not be necessary to form a separate coupling pattern.

Figure 6A:
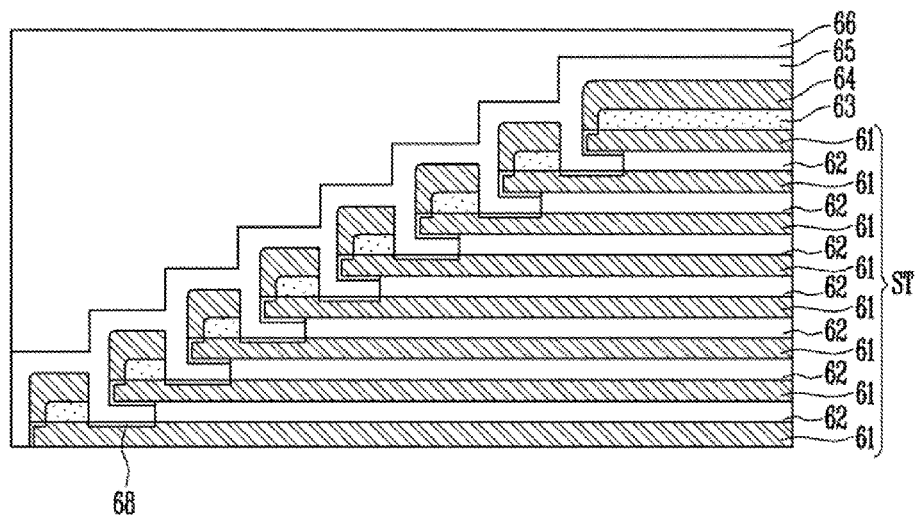
FIGS. 6A to 6E illustrate cross-sectional views of a process flow for a method of manufacturing a semiconductor device according to an embodiment of the present invention.
Figure 6B:
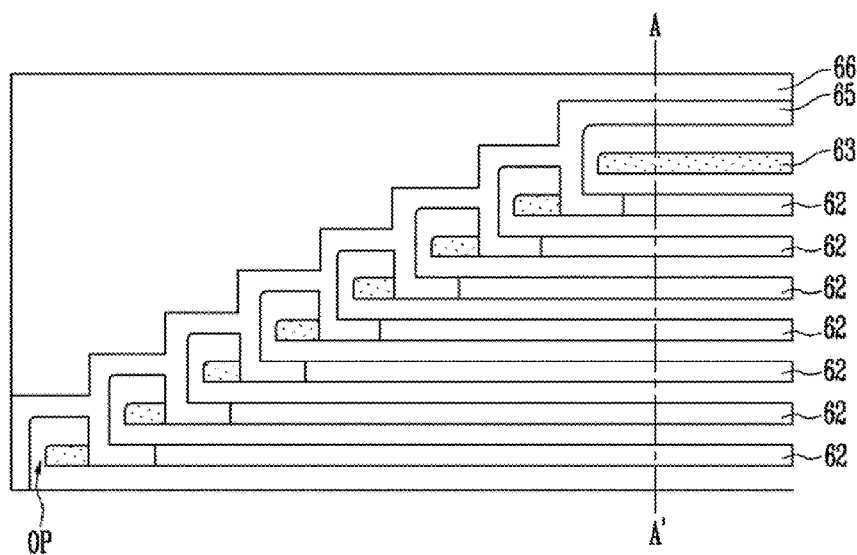
Figure 6C:
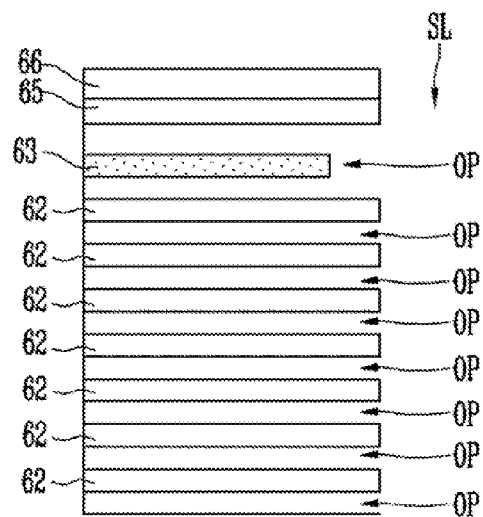
Figure 6D:
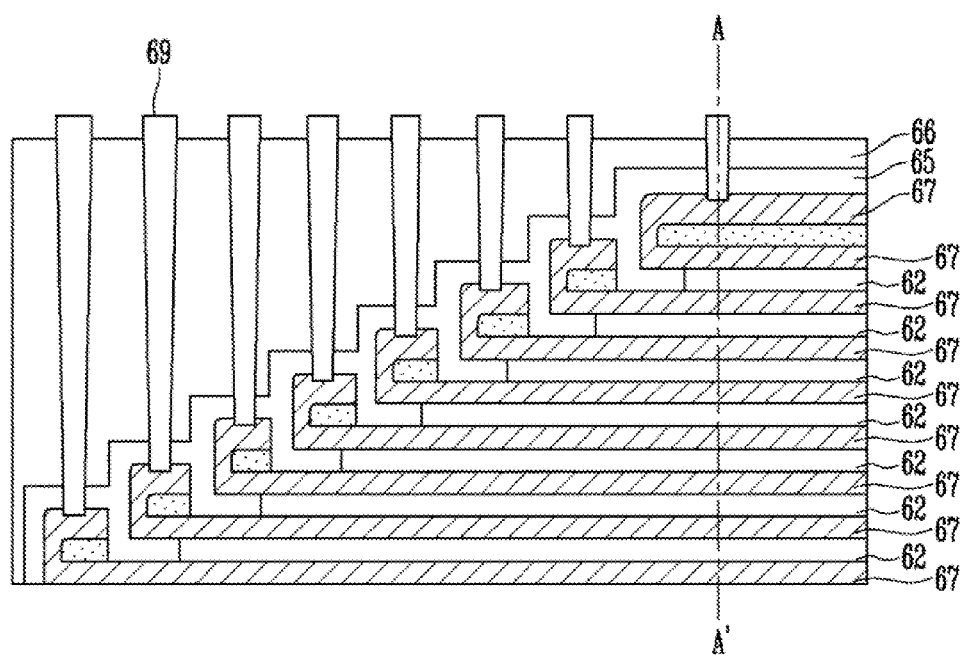
Figure 6E:
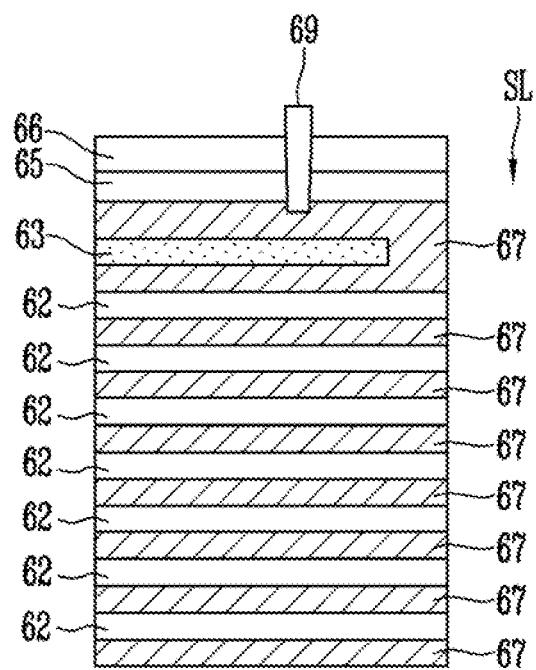

FIGS. 6A to 6G illustrate cross-sectional views of a process flow for a method of manufacturing a semiconductor device according to an embodiment of the present invention. FIG. 6C illustrates a cross-sectional view taken along A-A' of FIG. 6B. FIG. 6E illustrates a cross-sectional view taken along A-A' of FIG. 6D. Hereinafter, a description of common contents with the earlier described embodiments is omitted.

As Illustrated in FIG. 6A, first material layers 61 and second material layers 62 may be alternately stacked to form the stacked structure ST, and a sidewall of the stacked structure ST may be stepped. Subsequently, the second material layers 62, exposed on the sidewall of the stacked structure ST, may be etched to form the undercuts UC under the first material layers 61.

Subsequently, a first insulating layer may be formed on surfaces of the first material layers 61, exposed on the sidewall of the stacked structure ST, and the first insulating layer, formed in the undercuts UC, may be removed to form first insulating patterns 63. In comparison to the embodiment described above with reference to FIG. 5B, the first insulating layer may be further etched to form the first insulating patterns 63 having a relatively small width.

Subsequently, a second insulating layer 68 may be formed on the first material layers 61 exposed on the sidewall of the stacked structure ST. Thereafter, a third material layer may be formed over the first insulating patterns 63, and the third material layer, formed in the undercuts UC, may be removed to form third material patterns 64. Subsequently, a liner layer 65 may be formed on entire surfaces of the third material patterns 64 and fill the undercuts UC. Then, an interlayer insulating layer 66 may be formed on the liner layer 65.

As Illustrated in FIGS. 6B and 6C, the slit SL may be formed through the stacked structure ST, and the third material patterns 64 and the first material layers 61 may be removed through the slit SL.

Subsequently, the first insulating patterns 63 may be etched to a predetermined thickness. The second insulating layer 68 may also be removed. As a result, the first openings and the second openings may be connected to each other so that openings OP having a "C" shape may be formed.

As illustrated in FIGS. 6D and 6E, conductive layers 67 may be formed in the openings OP through the slit SL. Subsequently, contact plugs 69 may be formed through the interlayer insulating layer 66 and the liner layer 65 and coupled to the pads.

According to the above-described processes, a pad and a conductive layer configured as a gate electrode may be connected as a single layer. Therefore, it may not be necessary to form a separate coupling pattern.

Figure 7:
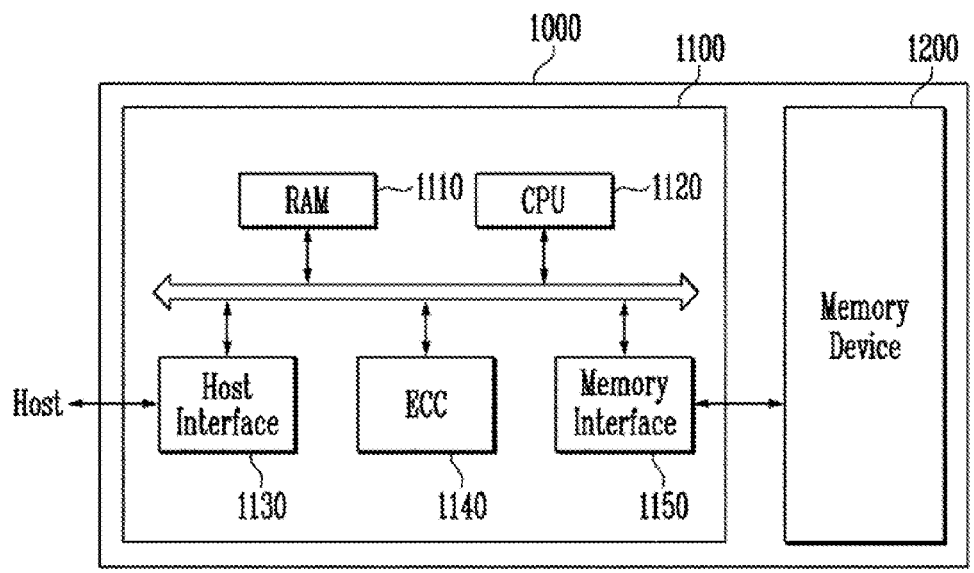
FIG. 7 is a block diagram illustrating the configuration of a memory system according to an embodiment of the present invention.

FIG. 7 is a block diagram illustrating the configuration of a memory system according to an embodiment of the present invention.

As illustrated in FIG. 7, a memory system 1000 according to an embodiment of the present invention may include a memory device 1200 and a controller 1100.

The memory device 1200 may be used to store various data types such as text, graphic and software code. The memory device 1200 may be a non-volatile memory and include the memory string described above with reference to FIGS. 1A to 6E. In addition, the memory device 1200 may include stacked structures including first conductive layers stacked stepwise and first insulating layers interposed between the first conductive layers, in which the first insulating layers include undercuts formed under the first conductive layers; pads coupled to the first conductive layers exposed on sidewalls of the stacked structures; and a liner layer formed on entire surfaces of the pads and filling the undercuts. Since the memory device 1200 is formed and manufactured in the above-described manner, a detailed description thereof will be omitted.

The controller 1100 may be coupled to a host and the memory device 1200, and may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The CPU 1120 may be suitable for controlling overall operations of the controller 1100. For example, the CPU 1120 may be suitable for operating firmware such as an FTL (Flash Translation Layer) stored in the RAM 1110.

The host interface 1130 may interface with the host. For example, the controller 1100 may communicate with the host through one of various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not Illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

Since the memory system 1000 according to an embodiment of the present invention includes the memory device 1200 having an increased degree of integration, a degree of integration of the memory system 1000 may also be increased.

Figure 8:
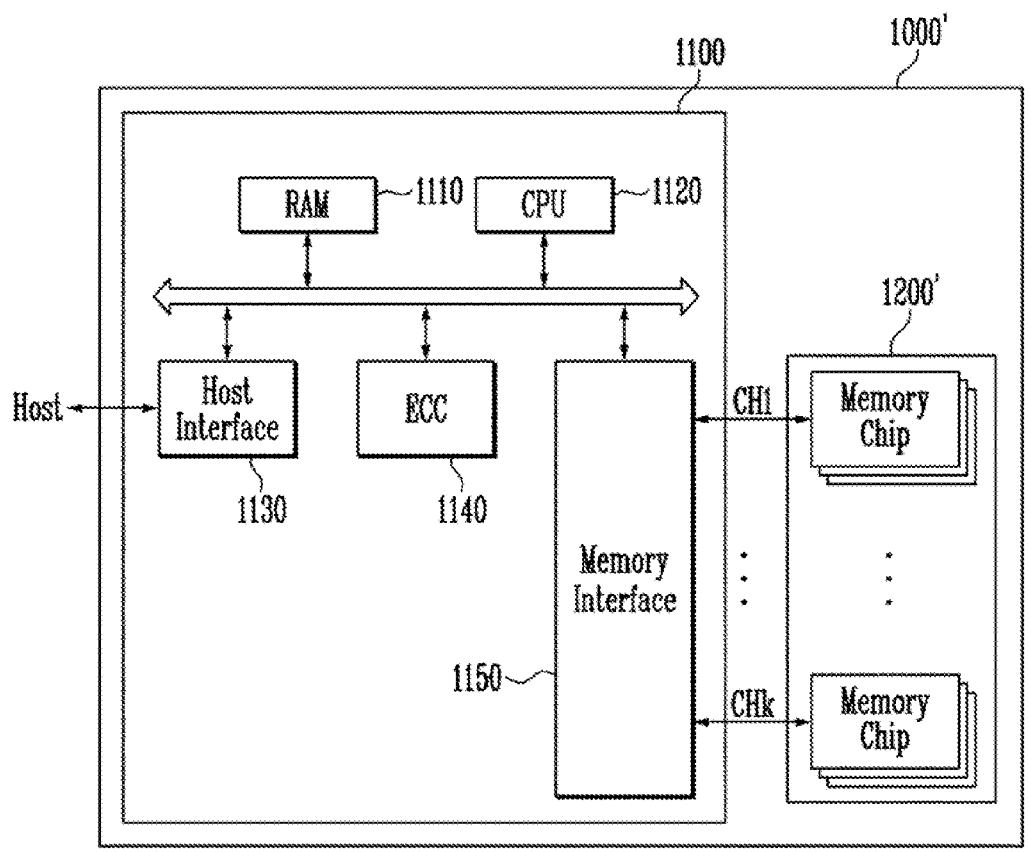
FIG. 8 is a block diagram illustrating the configuration of a memory system according to an embodiment of the preset invention.

FIG. 8 is a block diagram illustrating the configuration of a memory system according to an embodiment of the present invention. Hereinafter, a description of common contents with the earlier described embodiment is omitted.

As illustrated in FIG. 8, a memory system 1000' according to an embodiment of the present invention may include a memory device 1200' and the controller 1100. In addition, the controller 1100 may include the RAM 1110, the CPU 1120, the host interface 1130, the ECC circuit 1140 and the memory interface 1150.

The memory device 1200' may be a non-volatile memory device. The memory device 1200' may be the semiconductor device described above with reference to FIGS. 1A to 1D. In addition, the memory device 1200' may include a first stacked structure including first conductive layers and first insulating layers formed alternately with each other, first semiconductor patterns passing through the first stacked structure, a coupling pattern coupled to the first semiconductor patterns, and a slit passing through the first stacked structure and the coupling pattern. Since the memory device 1200' Is formed and manufactured in the above-described manufacturing method, a detailed description thereof will be omitted.

In addition, the memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, according to an embodiment of the present invention, since the memory system 1000' includes the memory device 1200' having improved characteristics of, for example cell current, characteristics of the memory system 1000' may also be improved. In addition, data storage capacity and driving speed of the memory system 1000' may be further increased by forming the memory device 1200' using a multi-chip package.

Figure 9:
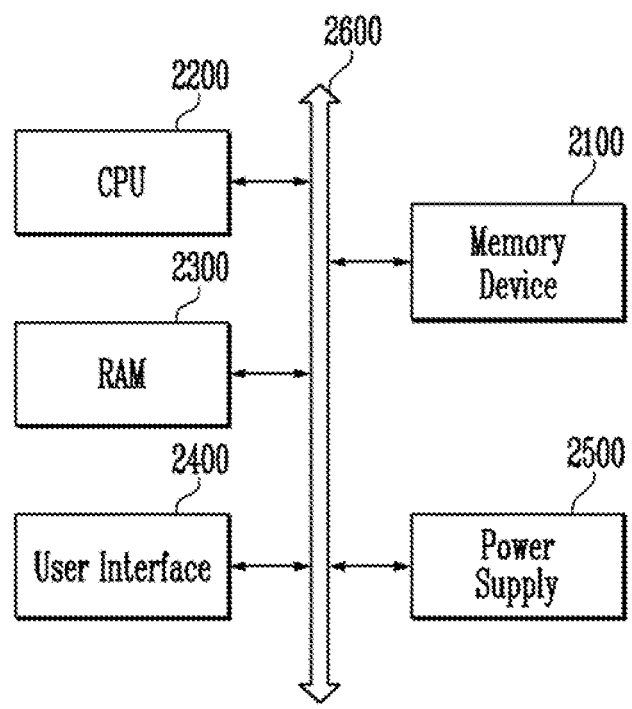
FIG. 9 is a block diagram illustrating the configuration of a computing system according to an embodiment of the present invention.

FIG. 9 is a block diagram illustrating the configuration of a computing system according to an exemplary embodiment of the present invention. Hereinafter, a description of common contents with the earlier described embodiments is omitted.

As illustrated in FIG. 9, a computing system 2000 according to an embodiment of the present invention may include a memory device 2100, a CPU 2200, a random-access memory (RAM) 2300, a user interface 2400, a power supply 2500 and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 through a controller (not Illustrated) or be directly coupled to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may be the semiconductor memory device described above with reference to FIGS. 1A to 6E. The memory device 2100 may include stacked structures including first conductive layers stacked stepwise and first insulating layers interposed between the first conductive layers, in which the first insulating layers include undercuts formed under the first conductive layers; pads coupled to the first conductive layers exposed on sidewalls of the stacked structures; and a liner layer formed on entire surfaces of the pads and filling the undercuts. Since the memory device 2100 is formed and manufactured in the above-described manner, a detailed description thereof will be omitted.

In addition, as described above with reference to FIG. 8, the memory device 2100 may be a multi-chip package composed of a plurality of memory chips.

The computing system 2000 having the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, since the computing system 2000 according to an embodiment of the present invention includes a memory device 2100 having an increased degree of integration, the degree of integration of the computing system 2000 may be increased accordingly.

Figure 10:
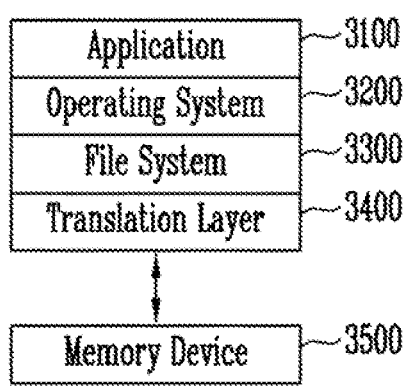
FIG. 10 is a block diagram illustrating a computing system according to an embodiment of the present invention.

FIG. 10 is a block diagram illustrating a computing system according to an embodiment of the present invention.

As illustrated in FIG. 10, a computing system 3000 according to an embodiment of the present invention may include a software layer that has an operating system 3200, an application 3100, a file system 3300 and a translation layer 3400. In addition, the computing system 3000 may include a hardware layer such as a memory system 3500.

The operating system 3200 manages software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

FIG. 10 illustrates the operating system 3200, the application 3100, and the file system 3300 in separate blocks. However, the application 3100 and the file system 3300 may be included in the operating system 3200.

The translation layer 3400 may translate an address to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL) or the like.

The memory device 3500 may be a non-volatile memory. The memory device 3500 may be the semiconductor memory device described above with reference to FIGS. 1A to 6E. In addition, the memory device 3500 may include stacked structures including first conductive layers stacked stepwise and first insulating layers interposed between the first conductive layers, in which the first insulating layers include undercuts formed under the first conductive layers; pads coupled to the first conductive layers exposed on sidewalls of the stacked structures; and a liner layer formed on entire surfaces of the pads and filling the undercuts. Since the memory device 3500 is formed and manufactured in the above-described manner, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer and driven by an operation memory. In addition, the translation layer 3400 may be included in the operating system layer or the controller layer.

As described above, since the computing system 3000 according to an embodiment of the present invention includes the memory device 3500 having an increased degree of integration, data storage capacity of the computing system 3000 may be improved.

According to an embodiment of the present invention, a bridge may be prevented when a contact plug is formed. In addition, since the thickness of ends of stacked gate electrodes is selectively increased, the height of a stacked structure may be reduced. Therefore, the degree of integration of a semiconductor device may be increased.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a stacked structure including first conductive layers stacked stepwise and first insulating layers interposed between the stacked first conductive layers, wherein the stacked structure includes a stepped sidewall; and
   contact pads formed over the first conductive layers exposed on the stepped sidewall of the stacked structure and electrically coupled to the first conductive layers, respectively, wherein each of the contact pads includes one or more second conductive layers and one or more second insulating layers stacked alternately.

2. The semiconductor device of claim 1, wherein undercuts are formed under the first conductive layers and extending between the pads.

3. The semiconductor device of claim 1, further comprising:
   a liner layer formed on the contact pads and interposed under contact regions of the first conductive layers in which the contact pads are formed.

4. The semiconductor device of claim 1, further comprising:
   a slit located between adjacent stacked structures;
   grooves formed in the first conductive layers, the second insulating layers and the second conductive layers exposed through the slit; and
   coupling patterns formed in the grooves and coupling the contact pads located over the second insulating layers and the first conductive layers located under the second insulating layers.

5. A semiconductor device, comprising:
   a stacked structure including first conductive layers stacked stepwise and first insulating layers interposed between the stacked first conductive layers, wherein each of the first conductive layers includes a first region covered by the first conductive layer located thereover and a second region extending from the first region;
   contact pads electrically coupled to the second regions of the respective first conductive layers; and
   a liner layer formed on the contact pads and extends to be interposed under the second region of respective first conductive layers.

6. The semiconductor device of claim 5, wherein the first insulating layers include undercuts formed under the first conductive layers and the undercuts are filled with the liner layer.

7. The semiconductor device of claim 5, wherein the contact pads are conductive and directly contact the second regions of the first conductive layers, respectively.

8. The semiconductor device of claim 5, further comprising:
   second insulating layers interposed between the second regions of the respective first conductive layers and the contact pads;
   a slit located between adjacent stacked structures;
   grooves formed in the first conductive layers, the second insulating layers and the contact pads exposed through the slit; and
   coupling patterns formed in the grooves and coupling the contact pads located over the second insulating layers and the first conductive layers located under the second insulating layers.

9. The semiconductor device of claim 5, further comprising:
   second insulating layers interposed between the second regions of the respective first conductive layers and the contact pads,
   wherein each of the contact pads surrounds a top surface and a sidewall of each of the second insulating layers and contacts a top surface of each of the first conductive layers.

10. A semiconductor device, comprising:
    a first conductive layer including a first contact region;
    a first contact pad electrically coupled to the first contact region of the first conductive layer;
    a second conductive layer located over the first conductive layer, including a second contact region and that is shorter than the first conductive layer to expose the first contact pad;
    a second contact pad coupled to the second contact region of the second conductive layer;
    an insulating layer interposed between the first and second conductive layers and that is shorter than the first and second conductive layers so that an undercut is formed under the second contact region of the second conductive layer; and
    a liner layer located on the first and second conductive layers to cover the first and second contact pads and fill the undercut;
    a stacked structure including first conductive layers stacked stepwise and first insulating layers interposed between the stacked first conductive layers, wherein each of the first conductive layers includes a first region covered by the first conductive layer located thereover and a second region extending from the first region;
    contact pads electrically coupled to the second regions of the respective first conductive layers; and
    a liner layer formed on the contact pads and extends to be interposed under the second region of respective first conductive layers.

* * * * *